United States Patent
Han

(10) Patent No.: US 9,508,609 B2
(45) Date of Patent: Nov. 29, 2016

(54) FIN FIELD EFFECT TRANSISTOR AND METHOD FOR FORMING THE SAME

(71) Applicants: Semiconductor Manufacturing International (Beijing) Corporation, Beijing (CN); Semiconductor Manufacturing International (Shanghai) Corporation, Shanghai (CN)

(72) Inventor: Qiuhua Han, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 105 days.

(21) Appl. No.: 14/336,050

(22) Filed: Jul. 21, 2014

(65) Prior Publication Data

US 2015/0041867 A1 Feb. 12, 2015

(30) Foreign Application Priority Data

Aug. 7, 2013 (CN) .......................... 2013 1 0342056

(51) Int. Cl.
*H01L 21/66* (2006.01)
*H01L 29/66* (2006.01)

(52) U.S. Cl.
CPC ............... *H01L 22/12* (2013.01); *H01L 22/20* (2013.01); *H01L 29/66795* (2013.01)

(58) Field of Classification Search
CPC ............. H01L 21/3086; H01L 29/785; H01L 29/66795; H01L 22/12

USPC ............................................. 257/288; 438/14
See application file for complete search history.

(56) References Cited

U.S. PATENT DOCUMENTS

| | | | | |
|---|---|---|---|---|
| 9,196,485 B2 * | 11/2015 | Leobandung | ....... | H01L 21/0337 |
| 9,331,201 B2 * | 5/2016 | Cheng | ................... | H01L 29/785 |
| 2008/0008969 A1 * | 1/2008 | Zhou | ................... | H01L 21/0337 430/313 |
| 2009/0253238 A1 * | 10/2009 | Shi | .................... | H01L 21/82343 438/279 |
| 2012/0043620 A1 * | 2/2012 | Guo | ...................... | H01L 21/845 257/391 |
| 2013/0244437 A1 * | 9/2013 | Flachowsky | ........ | H01L 21/3086 438/703 |
| 2014/0256093 A1 * | 9/2014 | Lin | ................... | H01L 21/82343 438/157 |
| 2016/0093502 A1 * | 3/2016 | Cheng | ................ | H01L 21/3086 257/623 |

\* cited by examiner

*Primary Examiner* — Victoria K Hall
(74) *Attorney, Agent, or Firm* — Anova Law Group, PLLC

(57) ABSTRACT

Various embodiments provide FinFETs and methods for forming the same. In an exemplary method, a semiconductor substrate having sacrificial layers formed thereon is provided. First sidewall spacers and second sidewall spacers are sequentially formed on both sides of each sacrificial layer. The sacrificial layers can be removed. A first width is measured as a distance between adjacent first sidewall spacers, and a second width is measured as a distance between adjacent second sidewall spacers. When the first width is not equal to the second width, the first sidewall spacers or the second sidewall spacers are correspondingly etched such that the first width is equal to the second width. The semiconductor substrate is etched using the first sidewall spacers and the second sidewall spacers as an etch mask, to form fins, such that a top of each fin has a symmetrical morphology.

17 Claims, 5 Drawing Sheets

FIN FIELD EFFECT TRANSISTOR AND METHOD FOR FORMING THE SAME

CROSS-REFERENCES TO RELATED APPLICATIONS

This application claims priority to Chinese Patent Application No. CN201310342056.0, filed on Aug. 7, 2013, the entire contents of which are incorporated herein by reference.

FIELD OF THE DISCLOSURE

The present disclosure relates to the field of semiconductor device fabrication and, more particularly, relates to fin field effect transistors and methods for forming the same.

BACKGROUND

With continuous development of semiconductor processing technology, semiconductor technology node follows development trend of Moore's Law and continues to shrink. In order to adapt to the shrinking process node, channel length of metal-oxide-semiconductor field effect transistor (MOSFET) needs to be continuously reduced. Reducing the channel length has advantages such as increasing chip (or die) density and increasing switching speed of the MOSFET.

However, with the reducing of the channel length of a device, the distance between source and drain of the device is also reduced accordingly. Thus, the ability of a gate to control the channel becomes lower. It becomes more difficult for gate voltage to pinch off the channel. As a result, a subthreshold leakage phenomenon, i.e., short-channel effects (SCE) can occur more easily.

Therefore, in order to better adapt to requirements of scaling down the size of the device, semiconductor processes have started to gradually transition from planar MOSFET to three-dimensional type transistor that has greater functionality, such as fin field effect transistor (FinFET). The gate of a FinFET can control an ultra-thin body (fin) at least from both sides, and thus can have a much greater ability to control the channel than the gate in a planar MOSFET device. Therefore, the gate of the FinFET can well suppress the SCE. In addition, in comparison with other devices, the FinFET can have better compatibility with existing integrated circuit manufacturing technology.

However, to meet the development trend of Moore's Law, the fin of a FinFET is required to have a smaller width (i.e. fin width). A fin width formed by etching a semiconductor substrate using a conventional mask as an etch mask can no longer meet the requirement. The disclosed methods and devices are directed to solve one or more problems set forth above and other problems.

BRIEF SUMMARY OF THE DISCLOSURE

One aspect of the present disclosure includes a method for forming a FinFET. In an exemplary method, a semiconductor substrate is provided. The semiconductor substrate can have a plurality of sacrificial layers formed thereon. A plurality of first sidewall spacers can be formed on the semiconductor substrate on both sides of each sacrificial layer of the plurality of sacrificial layers. A plurality of second sidewall spacers can be formed on the semiconductor substrate on both sides of the each sacrificial layer having the plurality of first sidewall spacers formed thereon. The plurality of sacrificial layers can be removed. A first width can be measured as a distance between two adjacent first sidewall spacers of the plurality of first sidewall spacers, and a second width can be measured as a distance between two adjacent second sidewall spacers of the plurality of second sidewall spacers. When the first width is not equal to the second width, the plurality of first sidewall spacers or the plurality of second sidewall spacers can be correspondingly etched such that the first width can be substantially equal to the second width. The semiconductor substrate can be etched using the plurality of first sidewall spacers and the plurality of second sidewall spacers as an etch mask, to form a plurality of fins, such that a top of each fin of the plurality of fins can have a substantially symmetrical morphology.

Another aspect of the present disclosure includes a semiconductor device. The semiconductor device can include a semiconductor substrate having a plurality of fins formed thereon. The plurality of fins can be formed by performing a process including the following exemplary steps. A plurality of sacrificial layers can be formed on the semiconductor substrate. A plurality of first sidewall spacers can be formed on the semiconductor substrate on both sides of each sacrificial layer of the plurality of sacrificial layers. A plurality of second sidewall spacers can be formed on the semiconductor substrate on both sides of the each sacrificial layer having the plurality of first sidewall spacers formed thereon. The plurality of sacrificial layers can be removed. A first width can be measured as a distance between two adjacent first sidewall spacers of the plurality of first sidewall spacers, and a second width can be measured as a distance between two adjacent second sidewall spacers of the plurality of second sidewall spacers. When the first width is not equal to the second width, the plurality of first sidewall spacers or the plurality of second sidewall spacers can be correspondingly etched, such that the first width can be substantially equal to the second width. The semiconductor substrate can be etched using the plurality of first sidewall spacers and the plurality of second sidewall spacers as an etch mask, to form the plurality of fins, such that a top of each fin of the plurality of fins can have a substantially symmetrical morphology.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In order to meet the development trend of Moore's Law, fin width of a FinFET need to become smaller and smaller. The fin width achieved using a conventional mask layer can no longer meet the need of a very small fin width.

One method for forming a fin of a FinFET is spacer image transfer (SIT). A sidewall spacer formed by SIT can have a width smaller than a width formed using a conventional mask layer. Therefore, when a semiconductor substrate is etched using the sidewall spacer as an etch mask, the width of a formed fin can be smaller than the width of a fin formed using the conventional mask layer.

Figure 1:
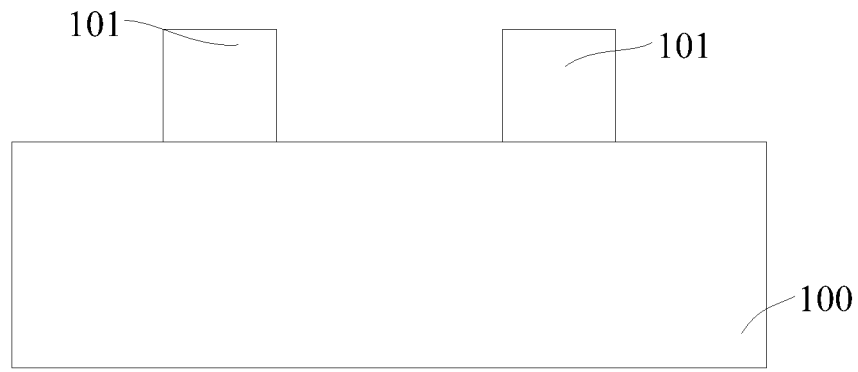
FIGS. 1-5 depict cross-sectional views of an exemplary FinFET at various stages during its formation.

FIGS. 1-5 depict cross-sectional views of an exemplary FinFET at various stages during its formation. Referring to FIG. 1, a semiconductor substrate 100 is provided. A plurality of sacrificial layers 101 are formed on a surface of the semiconductor substrate 100.

Figure 2:
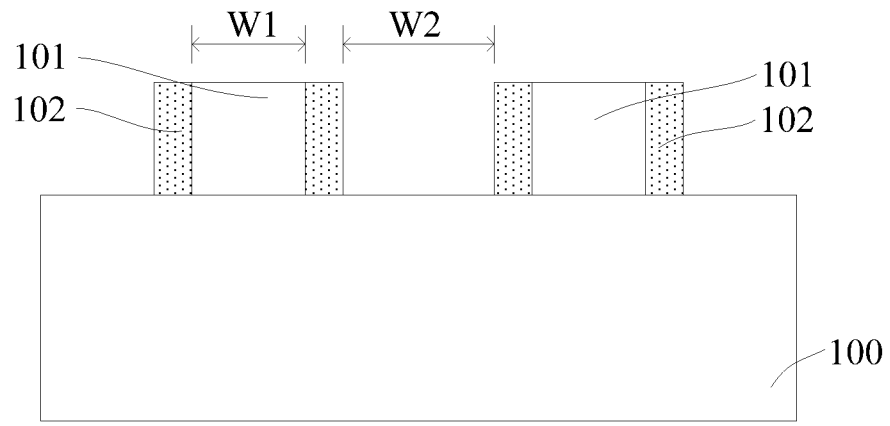
Figure 3:
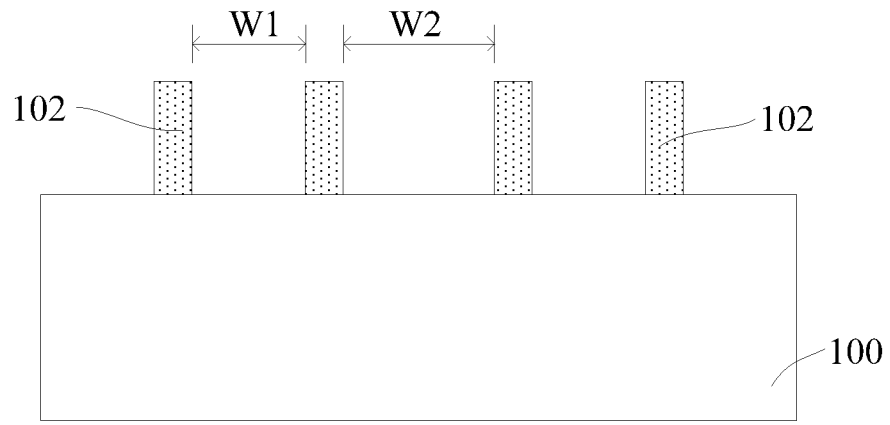

Referring to FIG. 2, sidewall spacers 102 are formed on the surface of the semiconductor substrate 100. The sidewall spacers 102 are formed next to (i.e., close to) both side surfaces of each sacrificial layer 101, respectively. Further, referring to FIG. 3, the sacrificial layers 101 are removed.

Figure 4:
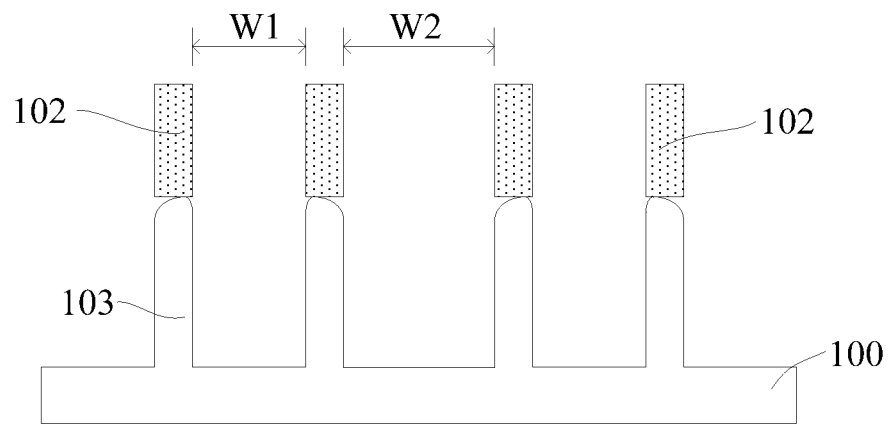

Referring to FIG. 4, the semiconductor substrate 100 is etched using the sidewall spacers 102 as an etch mask, to form fins 103. Further, referring to FIG. 5, the sidewall spacers 102 are removed.

The top of each fin 103 formed using the above-described method can have a different roundness at a different region. Morphology of the top of each fin 103 can be asymmetrical. So electrical properties of the FinFET can be adversely affected.

Causes of the above problems can include the following. For example, a region where a sacrificial layer 101 is located is a first region. The first region has a width W1. Before the sacrificial layer 101 is removed, a region enclosed by two adjacent sidewall spacers 102 (i.e., two adjacent sidewall spacers 102 having no sacrificial layer 101 therebetween) is a second region. The second region has a width W2.

Ideally, the width W1 of the first region is equal to the width W2 of the second region. Thus, process conditions for subsequently etching to form a fin can be the same at both sides of the top (i.e., the top portion) of the fin. However, in an actual process, it may be difficult to make the width W1 of the first region exactly equal to the width W2 of the second region. As a result, etching process conditions at both sides of the top of the fin can be different, and morphology of the top of each fin can thus be asymmetrical.

Figure 5:
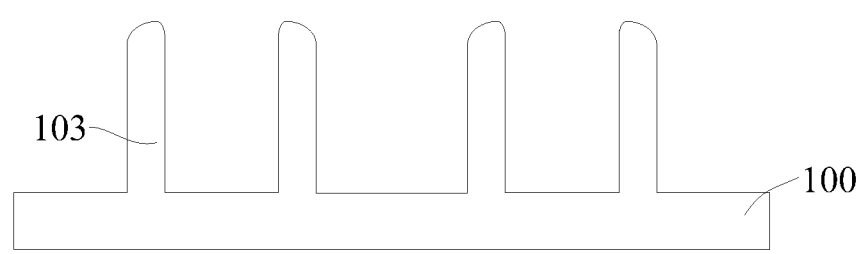

When the width W1 of the first region is smaller than the width W2 of the second region, during the subsequent process of etching to form the fin, the etching gas content (or etching gas amount) for etching the semiconductor substrate in the first region is less than the etching gas content for etching the semiconductor substrate in the second region. Therefore, the etching rate for the fin top portion (i.e., the top portion or the top of the fin) within the first region is relatively low, and the etching rate for the fin top portion near the second region is relatively high. As a result, the asymmetrical morphology of the top of the fin as shown in FIG. 5 is formed.

Similarly, when the width W1 of the first region is greater than the width W2 of the second region, the etching rate for the fin top portion within the first region is relatively high, and the etching rate for the fin top portion within the second region is relatively low. The morphology of the top of the formed fin is also asymmetrical.

Asymmetrical morphology of the top of the FinFET can cause defects at a contact surface between a subsequently formed gate structure and the fin, and thus can reduce reliability and electrical properties of the FinFET.

Various embodiments provide methods for forming a FinFET without such defects. In an exemplary method, first sidewall spacers can be formed on both sides of each sacrificial layer on the surface of a semiconductor substrate. Second sidewall spacers can then be formed on both sides of the first sidewall spacers (i.e., second sidewall spacers can be formed on both sides of each sacrificial layer that has the first sidewall spacers formed thereon). Thus, a first sidewall spacer can be located between a second sidewall spacer and one of the two sides of a sacrificial layer. That is, a second sidewall spacer and one of the two sides of a sacrificial layer can have a first sidewall spacer located therebetween.

As used herein, unless otherwise specified, in various embodiments, first sidewall spacers are formed on both side surfaces of each sacrificial layer, and one first sidewall spacer is formed on one side surface of each sacrificial layer. Second sidewall spacers can be formed on both side surfaces of each sacrificial layer that already has the first sidewall spacers formed thereon.

After the sacrificial layers are removed, the first sidewall spacers or the second sidewall spacers can be etched, such that a distance between adjacent first sidewall spacers (i.e., a distance between two adjacent first sidewall spacers directly facing each other, having no second sidewall spacers in between) can be equal to, or substantially equal to a distance between adjacent second sidewall spacers (i.e., a distance between two adjacent second sidewall spacers directly facing each other, having no first sidewall spacers in between). Subsequently, when the semiconductor substrate is etched using the first sidewall spacers and the second sidewall spacers as an etch mask to form fins, the fins can be substantially evenly (i.e. equally) spaced, and etching conditions on both sides of the top of the fin can be the same. The top of the formed fin can have a substantially symmetrical morphology. Thus, electrical properties of a FinFET can be improved. In addition, a width of the fin can be equal to or substantially equal to a sum of a width of the first sidewall spacer and a width of the second sidewall spacer after etching (i.e., after etching the first sidewall spacers or the second sidewall spacers). The width of the fin can be substantially small.

Figure 12:
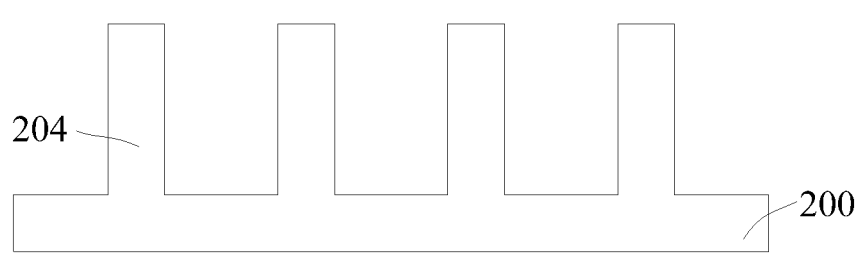
Figure 13:
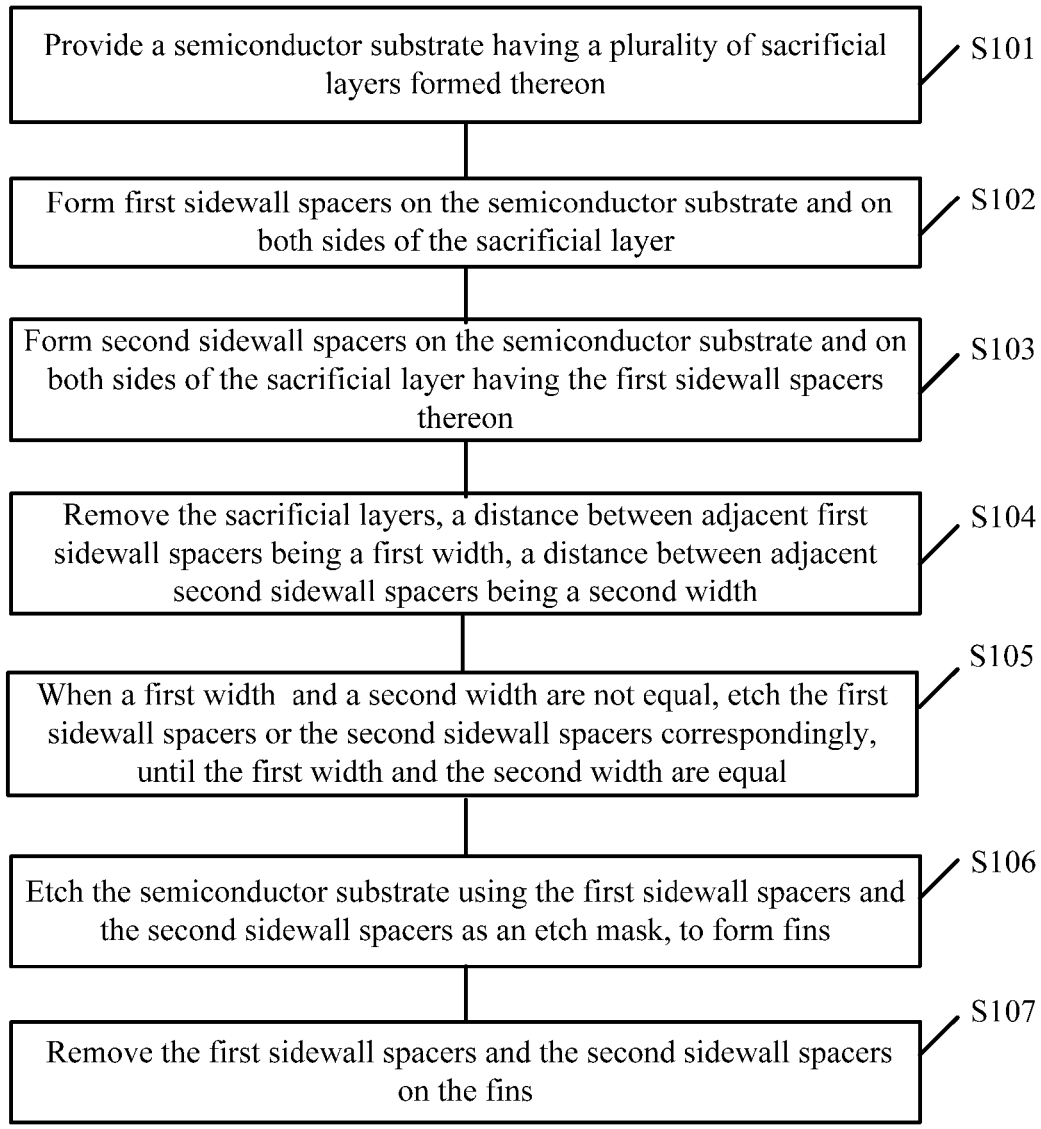
FIG. 13 depicts a flow diagram of an exemplary process for forming a FinFET in accordance with various disclosed embodiments.

FIG. 13 depicts a flow diagram of an exemplary method for forming a FinFET in accordance with various disclosed embodiments. FIGS. 6-12 depict cross-sectional views of the FinFET at various stages during its formation in accordance with various disclosed embodiments. Note that although FIGS. 6-12 depict structures corresponding to the method depicted in FIG. 13, the structures and the method are not limited to one another in any manner.

Figure 6:
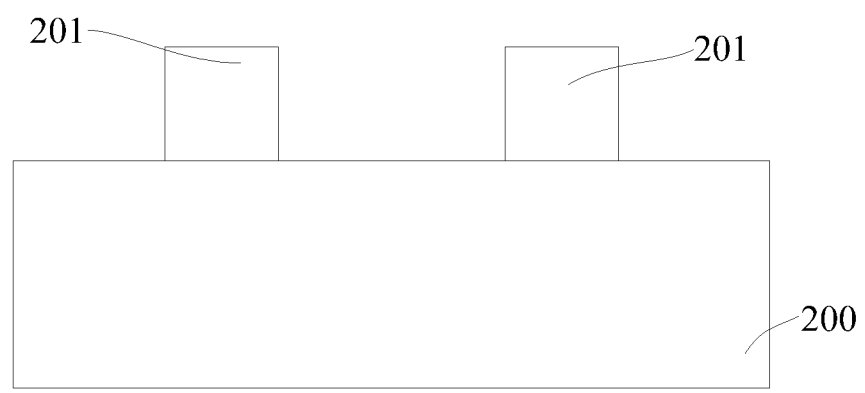
FIGS. 6-12 depict cross-sectional views of another exemplary FinFET at various stages during its formation in accordance with various disclosed embodiments.

In Step S101 of FIG. 13 and referring to FIG. 6, a semiconductor substrate 200 is provided. A plurality of sacrificial layers 201 are formed on a surface of the semiconductor substrate 200. In various embodiments, each sacrificial layer of the plurality of sacrificial layers 201 can refer to a sacrificial layer having any suitable shape, aspect ratio, and size, without limitation.

The semiconductor substrate 200 can be made of a material including, e.g., silicon, germanium, silicon-germanium, gallium arsenide, silicon carbide, and/or silicon-on-insulator. In one embodiment, the semiconductor substrate 200 can be made of a material including silicon.

The sacrificial layer 201 can include a photoresist (PR) layer, and/or an Advanced Patterning Film (APF) available from Applied Materials, Inc., located in Santa Clara, Calif. In one embodiment, the sacrificial layer 201 can include the APF. The APF can be made of a material including amorphous carbon. The sacrificial layer 201 can have a width ranging from about 500 angstroms to about 2000 angstroms.

Figure 7:
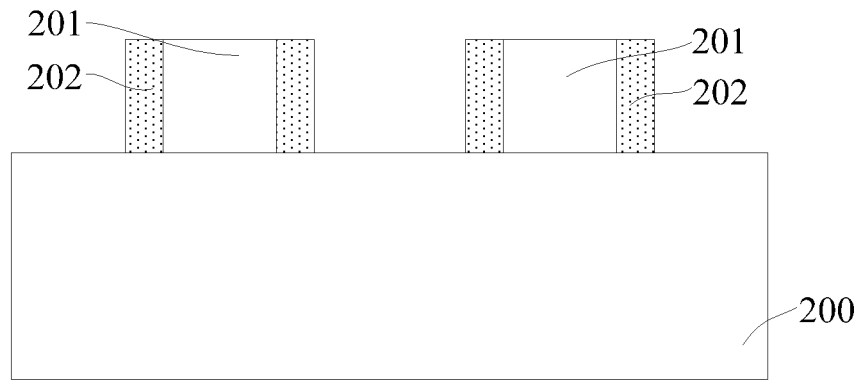

In Step S102 of FIG. 13 and referring to FIG. 7, first sidewall spacers 202 are formed on the surface of the semiconductor substrate 200. The first sidewall spacers 202 are located (i.e., formed) on both sides of the sacrificial layer 201. The first sidewall spacers 202 can be a portion of an etch mask layer for subsequently etching the semiconductor substrate 200 to form a fin. In various embodiments, a 'side' of the sacrificial layer 201 can refer to a sidewall of the sacrificial layer 201 that is perpendicular or nearly perpendicular to the surface of the semiconductor substrate 200.

The first sidewall spacers 202 can be made of a material including a nitride or an oxide. The nitride can include, e.g., SiN. The oxide can include, e.g., $SiO_2$. The process of forming the first sidewall spacers 202 can include, e.g., a chemical vapor deposition (CVD) process or an atomic layer deposition process.

In one embodiment, the first sidewall spacers 202 can be made of a material including $SiO_2$. The first sidewall spacers 202 can have a width ranging from about 20 angstroms to about 200 angstroms. The process of forming the first sidewall spacers 202 can include a chemical vapor deposition process.

Figure 8:
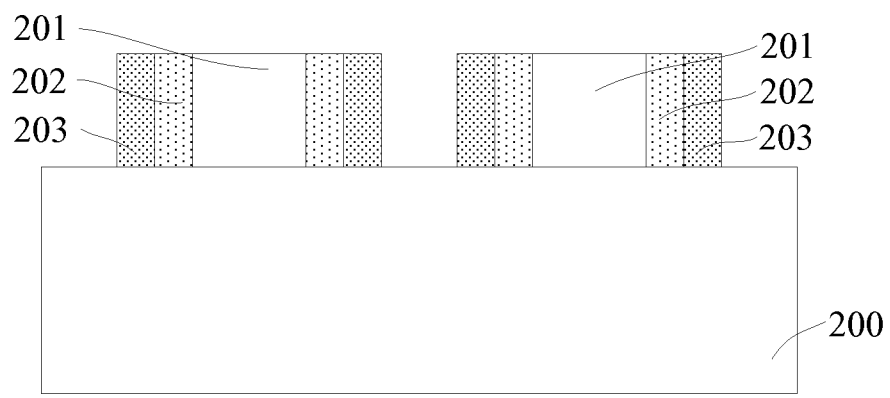

In Step S103 of FIG. 13 and referring to FIG. 8, second sidewall spacers 203 are formed on the surface of the semiconductor substrate 200. The second sidewall spacers 203 are formed on both sides of the sacrificial layer 201 having the first sidewall spacers 202 formed thereon. Thus, a first sidewall spacer can be located between a second sidewall spacer and one of the two sides of a sacrificial layer. That is, a second sidewall spacer and one of the two sides of a sacrificial layer can have a first sidewall spacer located therebetween. The first sidewall spacers 202 and the second sidewall spacers 203 can together serve as an etch mask layer for subsequently etching the semiconductor substrate 200 to form a fin.

The second sidewall spacers 203 can be made of a material including a nitride or an oxide. The nitride can include, e.g., SiN. The oxide can include, e.g., $SiO_2$. The process of forming the second sidewall spacers 203 can include, e.g., a chemical vapor deposition process or an atomic layer deposition process.

The material of the second sidewall spacers 203 and the material of the first sidewall spacers 202 can be different. Because the material of the second sidewall spacers 203 and the material of the first sidewall spacers 202 are different, etching selectivity of the second sidewall spacers 203 and the first sidewall spacers 202 can be different. That is, etching rate of the second sidewall spacers 203 and the first sidewall spacers 202 can be different in a certain etching process. As a result, a subsequent process of etching the first sidewall spacers 202 does not affect the second sidewall spacers 203, and a subsequent process of etching the second sidewall spacers 203 does not affect the first sidewall spacers 202.

For example, in one embodiment, the first sidewall spacers 202 can be made of a material including $SiO_2$. The second sidewall spacers 203 can be made of a material SiN. The second sidewall spacers 203 can have a width ranging from about 20 angstroms to about 200 angstroms. The second sidewall spacers 203 can be formed using a chemical vapor deposition process.

In some embodiments, the first sidewall spacers 202 and the second sidewall spacers 203 may be formed using a two-step process. In other embodiments, the first sidewall spacers 202 and the second sidewall spacers 203 can include an ON (Oxide-Nitride) structure that can be formed by a one-step process.

Figure 9:
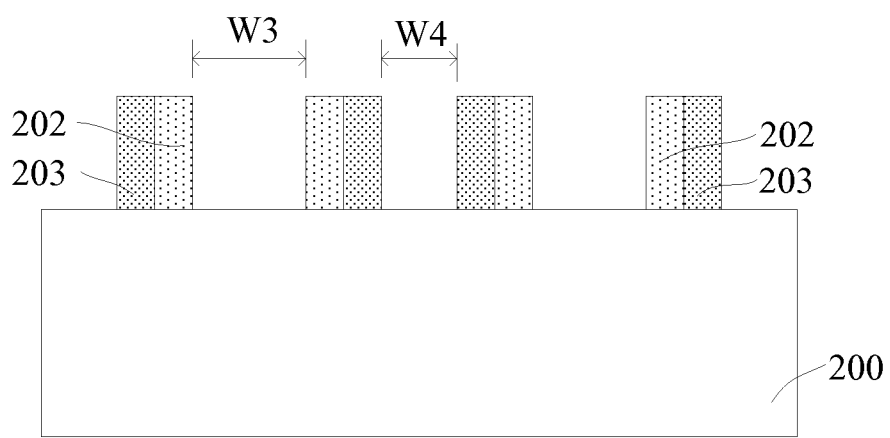

In Step S104 of FIG. 13 and referring to FIG. 9, the sacrificial layers 201 are removed. For example, a process of removing the sacrificial layers 201 can include a dry etching process.

In one example, in a dry etching process to remove the sacrificial layers 201, an etching gas can include HBr and $O_2$. The HBr can have a flow rate ranging from about 100 sccm to about 500 sccm. The $O_2$ can have a flow rate ranging from about 1 sccm to about 50 sccm. The reaction chamber can have a pressure ranging from about 1 mTorr to about 50 mTorr. The dry etching process can have a high-frequency radio frequency (power) ranging from about 100 watts to about 500 watts, and a low-frequency radio frequency (power) ranging from about 0 watts to about 200 watts.

Still referring to FIG. 9, a distance between adjacent first sidewall spacers 202 (i.e., two adjacent first sidewall spacers 202 directly facing each other, having no second sidewall spacers 203 in between) can be measured to be a first width W3, and a distance between adjacent second sidewall spacers 203 (i.e., two adjacent second sidewall spacers 203 directly facing each other, having no first sidewall spacers 202 in between) can be measured to be a second width W4. In an actual process, due to limitation of process conditions, it may be difficult to make the first width W3 equal to the second width W4.

In various embodiments, adjacent first sidewall spacers 202 can refer to two adjacent first sidewall spacers 202 directly facing each other, having no second sidewall spacers 203 in between. Adjacent second sidewall spacers 203 can refer to two adjacent second sidewall spacers 203 directly facing each other, having no first sidewall spacers 202 in between.

Figure 10:
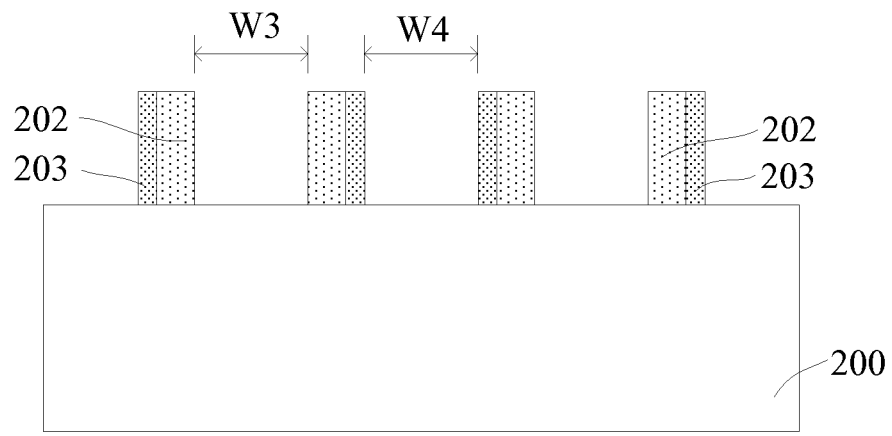

In Step S105 of FIG. 13 and referring to FIG. 10, when the first width W3 and the second width W4 are not equal, the first sidewall spacers 202 or the second sidewall spacers 203 are etched correspondingly, until the first width W3 and the second width W4 are equal. In one example, when the first width W3 is greater than the second width W4 before etching, the second sidewall spacers 203 can be etched until the first width W3 and the second width W4 are equal. In another example, when the first width W3 is smaller than the second width W4 before etching, the first sidewall spacers 202 can be etched until the first width W3 and the second width W4 are equal.

The process of etching the first sidewall spacers 202 or the second sidewall spacers 203 can include, e.g., a wet etching process, a dry etching process, or a combination thereof. In one embodiment, when the first sidewall spacers 202 are etched and the first sidewall spacers 202 are made of a material including an oxide, a SiCoNi etching process, and/or a wet etching process use an etching liquid including a diluted hydrofluoric acid (or DHF, or dilute HF) can be used for the etching. The DHF can have a volume ratio of water to hydrofluoric acid ranging from about 50:1 to about 1000:1.

In one embodiment, when the first sidewall spacers 202 are etched and the first sidewall spacers 202 are made of a material including a nitride, a wet etching process using an etching liquid including a hot phosphoric acid ($H_3PO_4$) solution can be used for the etching. The hot phosphoric acid solution can have a temperature ranging from about 120 degrees Celsius (° C.) to about 200° C., and a mass percentage of phosphoric acid ranging from about 65% to about 85%.

In one embodiment, when the second sidewall spacers 203 are etched and the second sidewall spacers 203 are made of a material including an oxide, a SiCoNi etching process and/or a wet etching process using an etching liquid including a DHF can be used for the etching. The DHF can have a volume ratio of water to hydrofluoric acid ranging from about 50:1 to about 1000:1.

In one embodiment, when the second sidewall spacers 203 are etched and the second sidewall spacers 203 are made of a material including a nitride, a wet etching process using an etching liquid including a hot phosphoric acid ($H_3PO_4$) solution can be used for the etching. The hot phosphoric acid solution can have a temperature ranging from about 120° C. to about 200° C., and a mass percentage of phosphoric acid ranging from about 65% to about 85%.

When the SiCoNi etching process, and/or a wet etching process having the DHF as the etching liquid is used, the etching process can have a high rate of etching the oxide, and the nitride can hardly be etched by the SiCoNi or the DHF. When the hot phosphoric acid solution is used as the etching liquid, the etching liquid can have a high rate of etching the nitride, and the oxide can hardly be etched by the hot phosphoric acid. Thus, the process of etching the first sidewall spacers 202 does not adversely affect the second sidewall spacers 203, and the process of etching the second sidewall spacers 203 does not adversely affect the first sidewall spacers 202.

A width to be etched from the first sidewall spacers 202 or the second sidewall spacers 203 can be equal to a half of an absolute value of a difference between the first width W3 and the second width W4 (|W3−W4|/2) before the etching. After an etching process and/or an etching liquid of a certain concentration (when applicable) is selected, the etching rate of the etching process and/or the etching liquid can be known. According to the width to be etched from the first sidewall spacers 202 or the second sidewall spacers 203, and the etching rate, an etching time of the wet etching process can be known.

For example, in one embodiment, the first width W3 can be greater than the second width W4 before etching, the first sidewall spacers 202 can be made of a material including $SiO_2$, and the second sidewall spacers 203 can be made of a material including SiN. In this case, before etching, the first width W3 can be greater than the second width W4. The second sidewall spacers 203 can then be etched. After the etching, the second width W4 can become greater, such that the first width W3 and the second width W4 can be equal.

In this case, the second sidewall spacers 203 can be made of a material including SiN. The wet etching process can use an etching liquid including a hot phosphoric acid solution. The hot phosphoric acid solution can have a temperature ranging from about 120° C. to about 200° C., and a mass percentage of phosphoric acid ranging from about 65% to about 85%.

The width to be etched from the second sidewall spacers 203 can be equal to the half of the absolute value of the difference between the first width W3 and the second width W4 (i.e., |W3−W4|/2) before the etching. After a hot phosphoric acid solution of a certain concentration is selected as the etching liquid, the etching rate of the etching liquid can be known. According to the width to be etched from the second sidewall spacers 203, and the etching rate of the etching liquid, a wet etching time of etching the second sidewall spacers 203 can be known.

Figure 11:
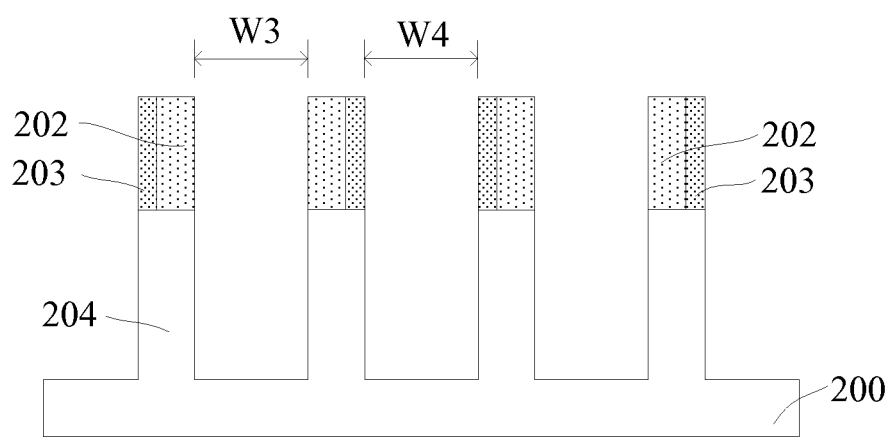

In Step S106 of FIG. 13 and referring to FIG. 11, additionally and/or optionally, the semiconductor substrate 200 is etched using the first sidewall spacers 202 and the second sidewall spacers 203 as an etch mask, to form fins 204. For example, a process of etching the semiconductor substrate 200 to form the fins 204 can include a dry etching process.

A first opening can be formed between (i.e., enclosed by) adjacent first sidewall spacers 202 (i.e., two adjacent first sidewall spacers 202 directly facing each other, having no second sidewall spacers 203 in between) and the surface of the semiconductor substrate 200 (before the etching of the semiconductor substrate 200). A second opening can be formed between adjacent second sidewall spacers 203 (i.e., two adjacent second sidewall spacers 203 directly facing each other, having no first sidewall spacers 202 in between) and the surface of the semiconductor substrate 200 (before the etching of the semiconductor substrate 200). Because after the etching of the first sidewall spacers 202 or the second sidewall spacers 203, the first width W3 and the second width W4 are equal, the width of the first opening and the width of the second opening can be equal.

The semiconductor substrate 200 can thus be etched along the first opening and the second opening using the first sidewall spacers 202 and the second sidewall spacers 203 as the etch mask, to form the fins 204.

Because the width of the first opening (i.e., the first width W3) and the width of the second opening (the second width W4) are equal, etching conditions can be substantially the same for etching the semiconductor substrate 200 along the first opening and for etching the semiconductor substrate 200 along the second opening. That is, etching gas content of the dry etching process at the first opening and at the second opening can be substantially the same. Therefore, etching rate for etching the semiconductor substrate 200 at both sides of the top of the subsequently-formed fins 204 can be the same. Thus, both sides of the top of each formed fin 204 can have the same roundness, and the top of the fin 204 can have a symmetrical morphology. When a gate structure is subsequently formed on the top and sidewalls of the fin 204 having a symmetrical morphology at the top, there can be fewer defects between the gate structure and the fin 204, and the formed FinFET can have desired electrical properties.

For example, in one embodiment, the dry etching process can have an etching gas including $Cl_2$ and/or HBr, a reaction chamber pressure (i.e., the pressure of the reaction chamber) ranging from about 1 mTorr to about 50 mTorr, a high-frequency radio frequency power of the etching ranging from about 150 watts to about 500 watts, and a low-frequency radio frequency power of the etching ranging from about 0 watts to about 150 watts. The HBr can have a flow rate ranging from about 100 sccm to about 1000 sccm. The $Cl_2$ can have a flow rate ranging from about 10 sccm to about 500 sccm.

During the dry etching process, the gas content of the $Cl_2$ and/or HBr for etching the semiconductor substrate 200 in the first opening can be substantially equal to the gas content of the $Cl_2$ and/or HBr for etching the semiconductor substrate 200 in the second opening. In addition, various regions inside the reaction chamber can have the same pressure and the same power of etching. Therefore, etching rate can be the same for the semiconductor substrate 200 (e.g., the semiconductor substrate 200 where the top of each fin 204 is located) both next to the first opening and next to the second opening. As a result, the top of the formed fin 204 can have a symmetrical morphology, which can help to improve quality of a gate structure formed on the surface of the fin 204 and thus to improving performance of the FinFET.

Further, a sum of the width of a first sidewall spacer 202 and the width of a second sidewall spacer 203 can be much smaller than a feature size achieved using a conventional photoresist as an etch mask. When the first sidewall spacers 202 and the width of the second sidewall spacers 203 are used as the etch mask, the width of the formed fin 204 can be equal to the sum of the width of a first sidewall spacer 202 and the width of a second sidewall spacer 203. Therefore, the formed fin 204 can have a small width accordingly.

In Step S107 of FIG. 13 and referring to FIG. 12, further, the first sidewall spacers 202 and the second sidewall spacers 203 on the surface of the fins 204 are removed. For example, the process of removing the first sidewall spacers 202 and the second sidewall spacers 203 can include a dry etching process and/or a wet etching process.

In one embodiment, a dry etching process that has a high etching rate for oxide and nitride and a low etching rate for silicon can be used for removing the first sidewall spacers 202 and the second sidewall spacers 203.

A source, a drain and a gate structure of the FinFET can subsequently be formed. Because both sides of the top of each formed fin 204 can have the same roundness, there can be desired surface states at the contact between the subsequently-formed gate structure and the fin 204, which can be advantageous for forming a FinFET having desired properties.

According to various embodiments, sacrificial layers can be formed on a semiconductor substrate. On both sides of each sacrificial layer, first sidewall spacers and second sidewall spacers can be sequentially formed. After the sacrificial layers are removed, the width of the first sidewall spacers or the second sidewall spacers can be reduced (or thinned) by etching, such that a distance between adjacent first sidewall spacers (i.e., a distance between two adjacent first sidewall spacers directly facing each other, having no second sidewall spacers in between, or a first width) can be equal to a distance between adjacent second sidewall spacers (i.e., a distance between two adjacent second sidewall spacers directly facing each other, having no first sidewall spacers in between, or a second width). Using the first sidewall spacers and the second sidewall spacers after the etching as an etch mask, the semiconductor substrate can be etched to form fins.

Therefore, the distance between adjacent first sidewall spacers (the first width) can be equal to the distance between adjacent second sidewall spacers (the second width). Thus, when the semiconductor substrate is etched to form the fins, the gas content of the etching gas at both sides of the top of the fins can be substantially the same, and thus the etching rate for both sides of the top of the fins can be the same. As a result, both sides of the top of each formed fin can have the same roundness. When a gate structure is subsequently formed, there can be desired surface states at the contact between the gate structure and the fin, which can improve reliability and electrical properties of the FinFET.

Next, in various embodiments, the width of the formed fin can be equal to a sum of the width of a first sidewall spacer and the width of a second sidewall spacer after the etching (i.e., after the etching of the first sidewall spacers or the second sidewall spacers). The sum of the width of the first sidewall spacer and the width of the second sidewall spacer can be much smaller than a feature size of a conventional etch mask (e.g. a conventional etch mask in existing technology). Thus, the FinFET formed in accordance with various disclosed embodiments can have a relatively small width, and the formed FinFET can have a high degree of integration.

Further, the material of the first sidewall spacers and the material of the second sidewall spacers can be different.

Various etching liquids (i.e., each etching liquid) or etching processes can have a different etching selectivity for the first sidewall spacers and the second sidewall spacers (i.e., different etching rate for the first sidewall spacer and the second sidewall spacer). Thus, when the first sidewall spacers are etched, the etching process does not cause damage/loss of the second sidewall spacers. When the second sidewall spacers are etched, the etching process does not cause damage/loss of the first sidewall spacers. A distance between adjacent first sidewall spacers (i.e., a first width) equal to a distance between adjacent second sidewall spacers (i.e., a second width) can thus be achieved using a simple and workable process.

Various embodiments also provide a semiconductor structure. The semiconductor structure may be used for forming a FinFET device or any other suitable devices. For example, referring to FIG. 12, an exemplary structure can include a semiconductor substrate 200 having a plurality of fins 204 formed thereon. The plurality of fins 204 can be formed using the method for forming a FinFET in accordance with various disclosed embodiments (e.g., as shown in FIGS. 6-12, FIG. 13). A source, a drain and a gate structure of the FinFET can also be formed. For example, a gate structure can be formed to wrap around part or all of a fin, and a source and a drain of the FinFET can accordingly be formed. The source and the drain can be formed based on the fin. Optionally, an ion implantation process can be used to dope the fin to complete the fabrication of the source and the drain.

In an exemplary method, sacrificial layers can be formed on a semiconductor substrate. The sacrificial layers can be made of a material including a photoresist. On both sides of each sacrificial layer, first sidewall spacers and second sidewall spacers can be sequentially formed. After the sacrificial layers are removed, the width of the first sidewall spacers or the second sidewall spacers can be reduced (or thinned, or trimmed) by etching, e.g., using SiCoNi, such that a distance between adjacent first sidewall spacers (i.e., a first width) can be equal to a distance between adjacent second sidewall spacers (i.e., a second width). Using the first sidewall spacers and the second sidewall spacers after the etching as an etch mask, the semiconductor substrate can be etched to form fins.

In one embodiment, the sacrificial layers can be made of a material including a photoresist or an APF. The semiconductor substrate can include a silicon substrate.

In one embodiment, the first sidewall spacers can be made of a material including SiN or $SiO_2$. The first sidewall spacers can have a width ranging from about 20 angstroms to about 200 angstroms. A process of forming the first sidewall spacers can include a chemical vapor deposition process or an atomic layer deposition process.

In one embodiment, after the first sidewall spacers are formed, the second sidewall spacers can be formed and can be made of a material including SiN or $SiO_2$. The second sidewall spacers can have a width ranging from about 20 angstroms to about 200 angstroms. A process of forming the second sidewall spacers can include a chemical vapor deposition process or an atomic layer deposition process.

In one embodiment, the first sidewall spacers and the second sidewall spacers can be made of a different material. That is, the material of the first sidewall spacers can be different from the material of the second sidewall spacers.

In one embodiment, when the first sidewall spacers or the second sidewall spacers made of an oxide is etched, a SiCoNi etching process or a wet etching process using a DHF as an etchant can be used for the etching. When the first sidewall spacers or the second sidewall spacers made of a nitride is etched, the etching process can use $H_3PO_4$ as an etchant.

In one embodiment, the first sidewall spacers and the second sidewall spacers can include an ON structure.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a FinFET, comprising:
providing a semiconductor substrate having a plurality of sacrificial layers formed thereon, each sacrificial layer having two sides;
forming a plurality of first sidewall spacers on the semiconductor substrate and having one first sidewall spacer on each side of each sacrificial layer of the plurality of sacrificial layers;
forming a plurality of second sidewall spacers on the semiconductor substrate and having one second sidewall spacer on each first sidewall spacer formed on each sacrificial layer, wherein the plurality of second sidewall spacers is made of a material different from the plurality of first sidewall spacers;
removing the plurality of sacrificial layers;
measuring a first width as a distance between two adjacent first sidewall spacers of the plurality of first sidewall spacers, and a second width as a distance between two adjacent second sidewall spacers of the plurality of second sidewall spacers;
when the first width is not substantially equal to the second width, correspondingly etching the plurality of first sidewall spacers or the plurality of second sidewall spacers such that the first width is substantially equal to the second width; and
etching the semiconductor substrate, using the plurality of first sidewall spacers and the plurality of second sidewall spacers as an etch mask, to form a plurality of fins, such that a top of each fin of the plurality of fins has a substantially symmetrical morphology.

2. The method according to claim 1, wherein the plurality of first sidewall spacers is made of a first material and the plurality of second sidewall spacers is made of a second material.

3. The method according to claim 2, wherein the first material or the second material includes a nitride or an oxide.

4. The method according to claim 3, wherein:
the nitride includes SiN; and
the oxide includes $SiO_2$.

5. The method according to claim 1, further including:
removing the plurality of first sidewall spacers and the plurality of second sidewall spacers on the plurality of fins.

6. The method according to claim 1, wherein each of the plurality of first sidewall spacers has a width ranging from about 20 angstroms to about 200 angstroms.

7. The method according to claim 1, wherein each of the plurality of second sidewall spacers has a width ranging from about 20 angstroms to about 200 angstroms.

8. The method according to claim 1, wherein the plurality of first sidewall spacers or the plurality of second sidewall spacers is formed using a process including a chemical vapor deposition process or an atomic layer deposition process.

9. The method according to claim 1, wherein the plurality of first sidewall spacers and the plurality of second sidewall spacers are formed using a two-step process or include an ON (Oxide-Nitride) structure formed by a one-step process.

10. The method according to claim 1, wherein, when the first width is not substantially equal to the second width, the correspondingly etching of the plurality of first sidewall spacers or the plurality of second sidewall spacers includes:
when the first width is greater than the second width, etching the plurality of second sidewall spacers until the first width is substantially equal to the second width; and
when the first width is smaller than the second width, etching the plurality of first sidewall spacers until the first width is substantially equal to the second width.

11. The method according to claim 10, wherein, when the plurality of first sidewall spacers is etched and the plurality of first sidewall spacers is made of a material including an oxide, the plurality of first sidewall spacers is etched using an SiCoNi etching process, a wet etching process using a diluted hydrofluoric acid (DHF), or a combination thereof.

12. The method according to claim 10, wherein,
when the plurality of first sidewall spacers is etched and the plurality of first sidewall spacers is made of a material including a nitride, the plurality of first sidewall spacers is etched using a wet etching process using a hot phosphoric acid solution.

13. The method according to claim 10, wherein,
when the plurality of second sidewall spacers is etched and the plurality of second sidewall spacers is made of a material including an oxide, the plurality of second sidewall spacers is etched using an SiCoNi etching process, a wet etching process using a DHF, or a combination thereof.

14. The method according to claim 10, wherein,
when the plurality of second sidewall spacers is etched and the plurality of second sidewall spacers is made of a material including a nitride, the plurality of second sidewall spacers is etched using a wet etching process using a hot phosphoric acid solution.

15. The method according to claim 1, wherein the each sacrificial layer includes a photoresist layer, an Advanced Patterning Film (APF), or a combination thereof.

16. The method according to claim 15, wherein the APF is made of a material including amorphous carbon.

17. The method according to claim 1, wherein the plurality of sacrificial layers is removed using a process including a dry etching process.

* * * * *